(12) United States Patent
Takahashi et al.

(10) Patent No.: US 10,256,789 B2
(45) Date of Patent: Apr. 9, 2019

(54) DISPLACEMENT CONVERSION MECHANISM AND TUNABLE FILTER DEVICE

(71) Applicant: Kabushiki Kaisha Toshiba, Minato-ku (JP)

(72) Inventors: Hiroshi Takahashi, Yokohama (JP); Junya Tanaka, Ota (JP); Rie Katsuki, Kawasaki (JP); Hiroyuki Kayano, Fujisawa (JP); Noritsugu Shiokawa, Yokohama (JP); Tamio Kawaguchi, Kawasaki (JP); Hiroaki Ikeuchi, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 45 days.

(21) Appl. No.: 15/394,965

(22) Filed: Dec. 30, 2016

(65) Prior Publication Data

US 2017/0288643 A1    Oct. 5, 2017

(30) Foreign Application Priority Data

Mar. 29, 2016    (JP) .................... 2016-065742

(51) Int. Cl.
  *H03H 9/54*    (2006.01)
  *H03H 9/17*    (2006.01)
  *H01P 1/208*    (2006.01)
  *H04R 17/00*    (2006.01)

(52) U.S. Cl.
  CPC ............ *H03H 9/54* (2013.01); *H01P 1/2084* (2013.01); *H03H 9/17* (2013.01); *H04R 17/00* (2013.01)

(58) Field of Classification Search
  CPC ............ H03H 9/54; H03H 9/17; H01P 1/2084
  USPC ................................................ 333/186
  See application file for complete search history.

(56) References Cited

U.S. PATENT DOCUMENTS

| 4,644,213 A | 2/1987 | Shibuya |
| 4,855,633 A | 8/1989 | Shibuya |
| 2009/0167460 A1 | 7/2009 | Akasegawa et al. |

FOREIGN PATENT DOCUMENTS

| JP | 61-177177 A | 8/1986 |
| JP | 62-107596 U | 7/1987 |
| JP | 2-25340 A | 1/1990 |
| JP | 9-215347 A | 8/1997 |
| JP | 2875896 B2 | 3/1999 |
| JP | 2001-211004 A | 8/2001 |
| JP | 2002-141705 A | 5/2002 |

(Continued)

*Primary Examiner* — Benny T Lee
*Assistant Examiner* — Hafizur Rahman
(74) *Attorney, Agent, or Firm* — Oblon, McClelland, Maier & Neustadt, L.L.P.

(57) ABSTRACT

A displacement conversion mechanism of an embodiment is a displacement conversion mechanism which is provided with a base, a displacement element which is in contact with the base and is displaced in a first direction, a first displacement portion which is in contact with the displacement element and can be displaced in the first direction, a second displacement portion which connects to an end of the first displacement portion at a first connection portion, and connects to the base at a second connection portion, and a third displacement portion which connects to the other end of the first displacement portion, connects to an end portion of the second displacement portion at a fourth connection portion, and can be displaced in a second direction intersecting with the first direction.

15 Claims, 11 Drawing Sheets (56) References Cited

FOREIGN PATENT DOCUMENTS

| | | | |
|---|---|---|---|
| JP | 2002-204102 | A | 7/2002 |
| JP | 2008-28835 | A | 2/2008 |
| JP | 2008-99399 | A | 4/2008 |
| JP | 2008-172652 | A | 7/2008 |
| JP | 2009-65777 | A | 3/2009 |
| JP | 2009-177349 | A | 8/2009 |
| JP | 2015-100082 | A | 5/2015 |
| JP | 2015-100097 | A | 5/2015 |

DISPLACEMENT CONVERSION MECHANISM AND TUNABLE FILTER DEVICE

CROSS-REFERENCE TO RELATED APPLICATION

This application is based upon and claims the benefit of priority from the prior Japanese Patent Application No. 2016-065742, filed on Mar. 29, 2016, the entire contents of which are incorporated herein by reference.

Field

Embodiments of the present invention relates to a displacement conversion mechanism and a tunable filter device.

Background

In a filter device to be used in a communication device system and so on, and particularly in a bandpass filter, frequency characteristic provided with an extremely steep skirt characteristic is required, so that only a desired frequency band is transmitted, and interference between adjacent frequency bands does not occur. In addition, a bandpass filter in which frequency characteristic such as a center frequency and a bandwidth can be made variable is essential, for the construction of infrastructure which can flexibly deal with change of a system.

In view of the status like this, a tunable filter device in which frequency characteristic is made variable by changing a gap length between a filter substrate and a dielectric body has been proposed for a long time.

A conventional tunable filter device is configured so as to mainly use a piezoelectric element as a drive element, to drive a dielectric body, and accordingly, miniaturization of a tunable mechanism and high accuracy of positioning can be realized comparatively easily, and thereby miniaturization of the whole filter device and high performance thereof can be expected.

A conventional tunable filter device is configured by a mechanism to move up and down a support rod to support a dielectric body by the displacement of a piezoelectric element. The piezoelectric element is driven by applying a publicly-known drive method, such as a stick and slip method, and thereby an accurate position control and a moving distance in a wide range can be realized.

But, since the stick and slip method is a friction drive method, a sliding surface is made to generate heat at the time of high speed operation, and thereby not only the speeding up is restricted, but drive displacement characteristic is deteriorated by variation and fluctuation of a drive condition resulting from abrasion of the sliding surface during a long term operation, and accordingly the stick and slip method has a problem in high speed driving and long term stable driving.

In addition, in a tunable filter device, a configuration in which a filter substrate, a dielectric body and a drive element (a piezoelectric element) are housed in a metal case is used, and an operation displacement of the piezoelectric element itself housed in the metal case is small, and in order to obtain an operation displacement required for a tunable filter device, there is a problem such that the piezoelectric element is to be enlarged.

DETAILED DESCRIPTION

Hereinafter, displacement conversion mechanisms and tunable filter devices according to embodiments will be described with reference to the drawings. Ones given with the same symbols indicate the same ones. In addition, the drawings are schematic or conceptual, and the relation between a thickness and a width of each portion, and a ratio coefficient of sizes between portions, and so on are not necessarily the same as the actual ones. In addition, in the case that the same portions are shown, the respective dimensions and ratio coefficients may be shown to be different depending on the drawings.

First Embodiment

Figure 1:
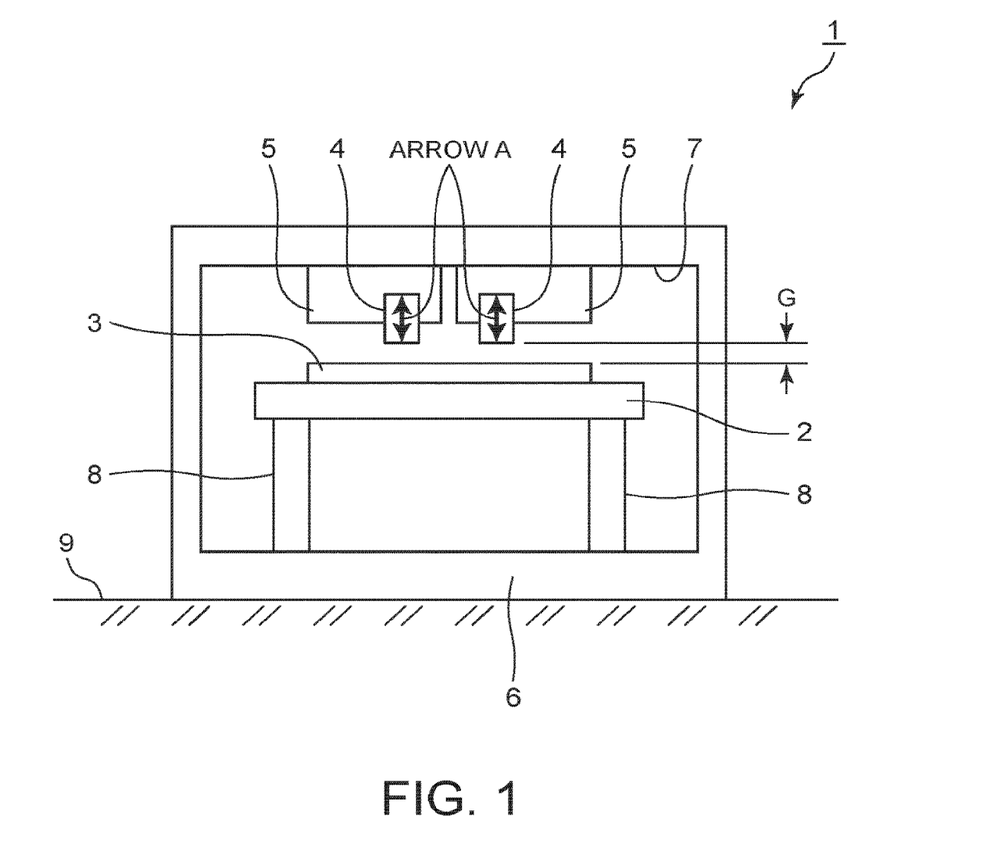
FIG. 1 is a diagram showing a tunable filter device 1 according to a first embodiment.

FIG. 1 is a diagram showing a tunable filter device 1 according to a first embodiment.

The tunable filter device 1 forms a closed space by a device base 6 installed on a base 9 and a top board portion 7 above this device base 6. The tunable filter device 1 is provided with a plurality of supports 8 in each of which one end is fixed to the device base 6 and the other end supports the cold plate 2, and has heat insulation performance to block heat inflow from the base 9 and the device base 6, in order to keep a cold plate 2 in the closed space in a prescribed low temperature state, and a refrigerator not shown for keeping the cold plate 2 in the prescribed low temperature state.

A superconductive filter substrate 3 is fixed in contact to the cold plate 2. On the other hand, a displacement conversion mechanism 5 constituting a tunable mechanism is arranged on the top board portion 7. The displacement conversion mechanism 5 is provided with a dielectric body 4 which is arranged opposite and with a gap length G at a prescribed position of a circuit (not shown). Here, the circuit includes a resonant element and is formed of a superconductive film on the surface of the filter substrate 3 in approximately parallel with each other. And, the displacement conversion mechanism 5 can drive the dielectric body within a prescribed movement range in directions (an arrow A) which are approximately vertical to the surface of the filter substrate 3.

The gap length G is an initial gap length between the filter substrate 3 and the dielectric body 4. The displacement conversion mechanism 5 is operated, and the dielectric body 4 is driven in the directions of the arrow A, to change the gap length G, and thereby the frequency characteristic can be made variable.

Figure 2A:
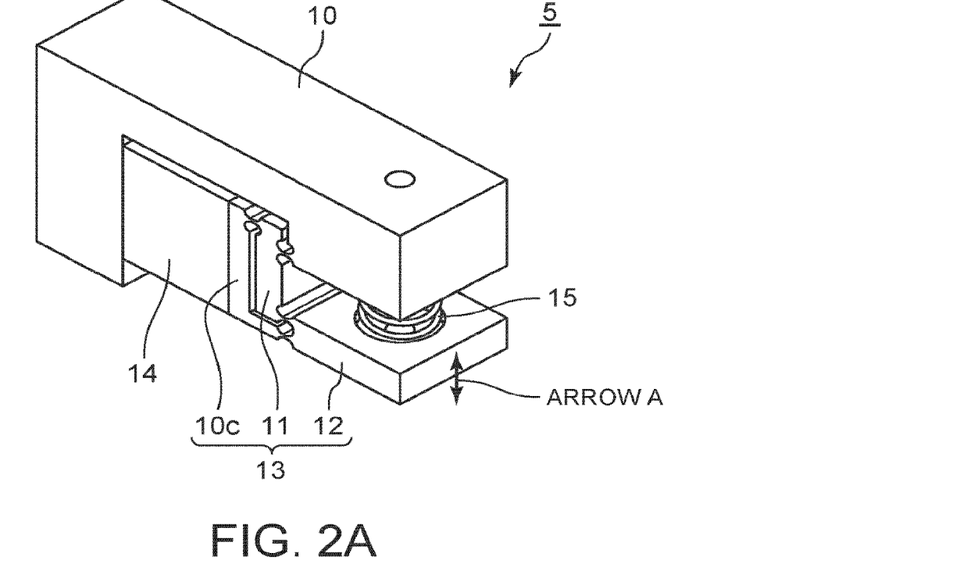
FIG. 2A is a diagram showing the displacement conversion mechanism 5 according to the first embodiment.
Figure 2B:
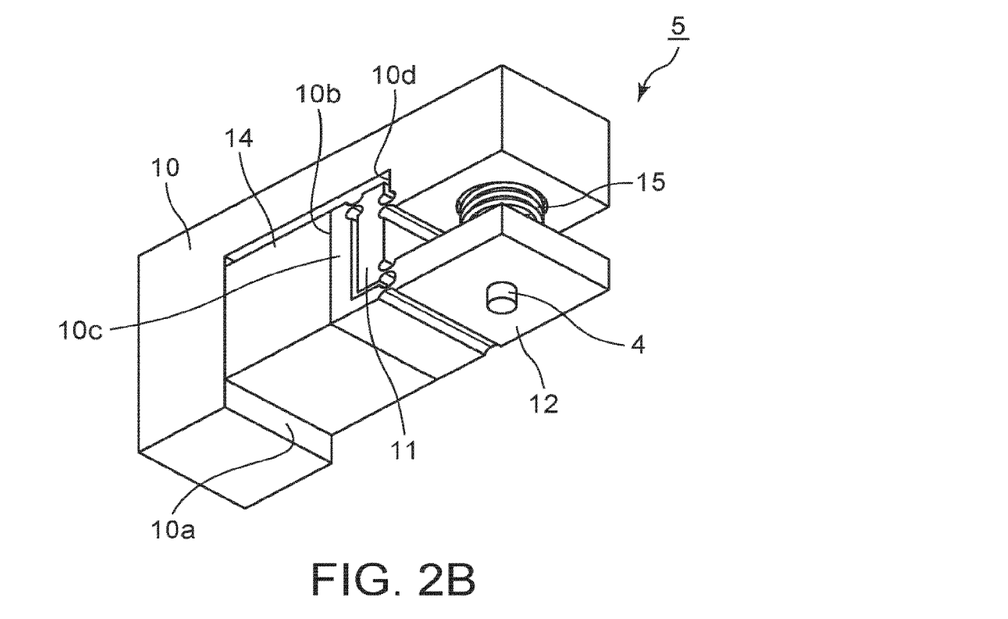
FIG. 2B is a diagram showing the displacement conversion mechanism 5 according to the first embodiment.

FIGS. 2A, 2B are perspective views showing a configuration of the displacement conversion mechanism 5 for driving the dielectric body in the tunable filter device 1. The displacement conversion mechanism 5 is provided with a base 10, a two-stage displacement conversion lever 13 composed of a first displacement portion 10c, a second displacement portion 11 and a third displacement portion 12, a piezoelectric element 14, a compression spring 15.

Figure 3A:
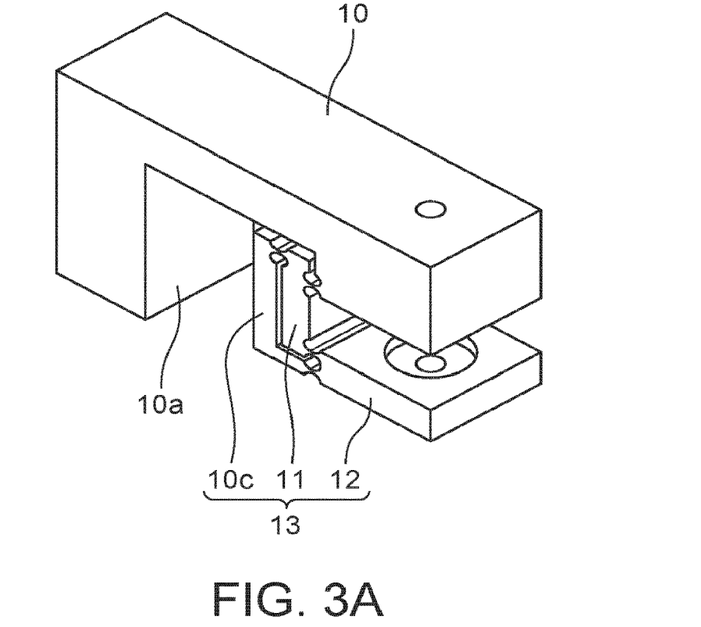
FIG. 3A is diagram showing the base 10 of the displacement conversion mechanism 5 according to the first embodiment.
Figure 3B:
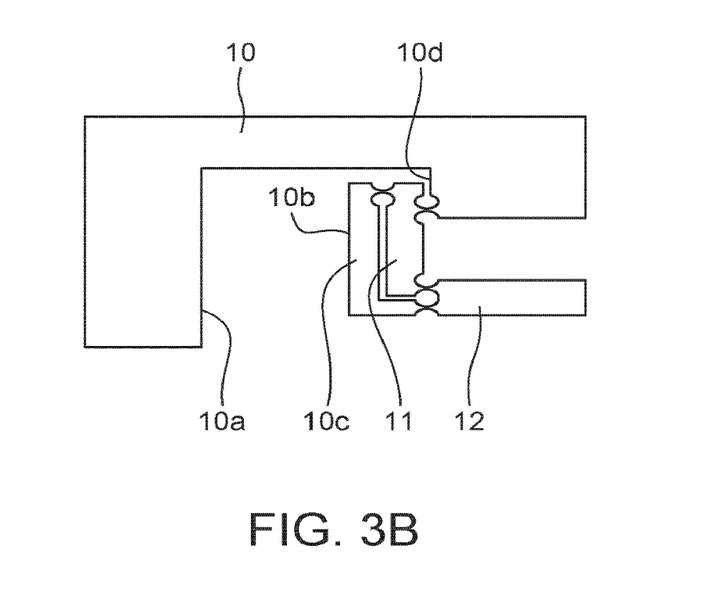
FIG. 3B is diagram showing the base 10 of the displacement conversion mechanism 5 according to the first embodiment.

FIGS. 3A and 3B are diagrams showing an external form of the base 10 and the two-stage displacement conversion lever 13. The base 10 and the two-stage displacement conversion lever 13 are formed integrally by a wire-cut processing or the like, and incorporate the piezoelectric element 14. The piezoelectric element 14 is provided such that one end of the piezoelectric element 14 is pressure-welded to a first base surface 10a, and the other end of the piezoelectric element 14 is pressure-welded to a second base surface 10b. The first base surface 10a and the second base surface 10b are located opposite to each other.

Without being limited by wire-cut processing, the two-stage displacement conversion lever 13 can also be manufactured by casting using a mold, laser beam machining or electric discharge machining. The base 10 is fixed to the top board portion 7 of the device base 6 in the tunable filter device 1, and the dielectric body 4 is mounted on the third displacement portion 12. The dielectric body 4 is press-fitted to or is bonded and fixed to the third displacement portion 12.

Figure 4:
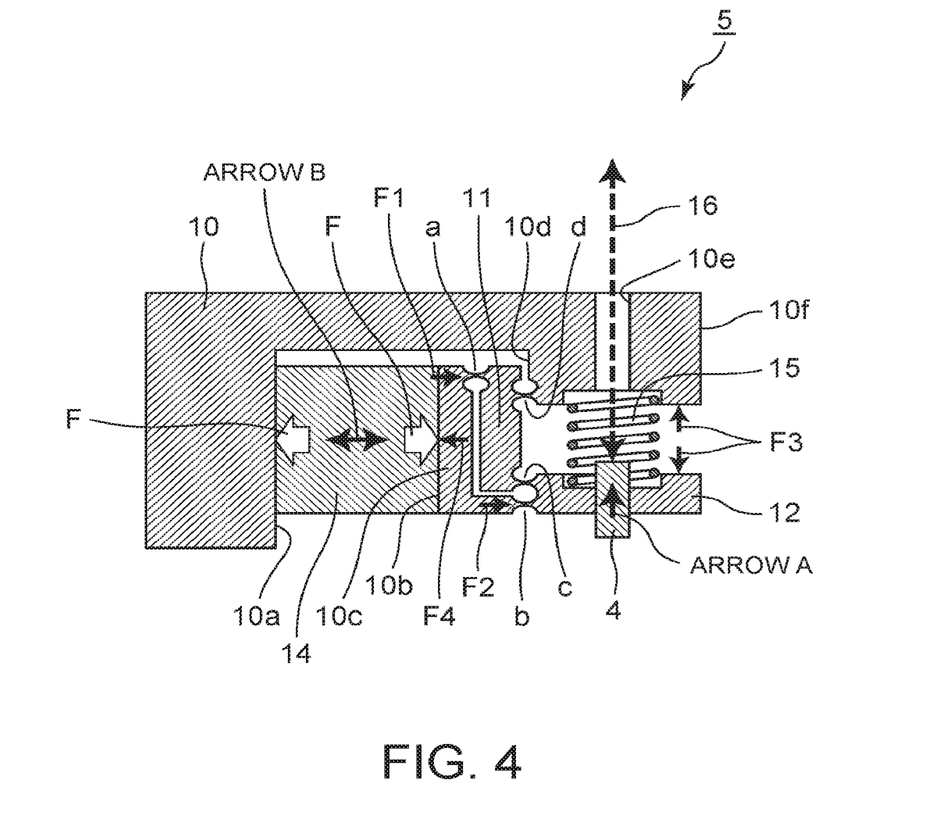
FIG. 4 is a sectional view of the displacement conversion mechanism 5 according to the first embodiment.

FIG. 4 is a sectional view for explaining an operation of the displacement conversion mechanism 5. When the piezoelectric element 14 is driven, operational displacements are generated in directions of an arrow B (a horizontal direction in the drawing), and forces F in the opposite directions respectively act on the first base surface 10a and the second base surface 10b of the base 10. The generation force F of the piezoelectric element 14 gives respective component forces F1, F2 of the generation force F, via the first displacement portion 10c provided with the second base surface 10b, to a connection portion a with the second displacement portion 11 (a connection portion "a" in the drawing) and a connection portion b with the third displacement portion 12.

The second displacement portion 11 is provided with a connection portion c with the third displacement portion 12, and is further provided with a connection portion d with a third base surface 10d of the base 10 between the connection portion a and the connection portion c. Specifically, the first displacement portion 10c and the second displacement portion 11 are arranged in parallel with each other via a gap. One end of the first displacement portion 10c and one end of the second displacement portion 11 connect to each other at the connection portion a. The second displacement portion 11 is connected to the facing third base surface 10d of the base 10 at the connection portion d. The other end of the first displacement portion c connects to an end portion of the third displacement portion 12 at the connection portion b, and the other end of the second displacement portion 11 connects to an end portion of the third displacement portion 12 at the connection portion c. The connection portion b and the connection portion c are arranged in the neighborhood to each other. The connection portion d is located between the connection portion a and the connection portion c.

And the piezoelectric element 14 is driven and displaced in the B direction, to give a displacement in the clockwise direction to the second displacement portion 11 around the connection portion d as the fulcrum, while the connection portion a, the connection portion d, and the connection portion c serve respectively as a force point, a fulcrum point, and a working point. This displacement is caused by the component force F1 of the piezoelectric element 14 acting on the connection portion a.

Simultaneously, the component force F2 of the piezoelectric element 14 acts on the connection portion b, to thereby give a displacement in the counterclockwise direction to the third displacement portion 12 around the connection portion c as the fulcrum. By this means, the dielectric body 4 mounted on the third displacement portion 12 is displaced. The dielectric body 4 is supported movably in the direction of the arrow A in a prescribed moving range and moves linearly, in accordance with an operational displacement of the piezoelectric element 14 and a displacement conversion ratio of the two-stage displacement conversion lever 13.

Here, each of the connection portions a, b, c, d is an elastic hinge with an approximately arc-shaped notch structure, and is connected and supported in an elastically deformable state in which the stiffness thereof is high in the acting direction of the force such as the component forces F1, F2, and the stiffness thereof is low in the otherwise direction. The piezoelectric element 14 moves finely, and since the two-stage displacement conversion lever 13 can operates sufficiently within an elastically deformable range by the elastic hinge, a mechanical sliding portion can be excluded from each of the connection portions a, b, c, d. As a result of this, characteristic variation and fluctuation in the driving displacement which are to be generated by an effect of an unstable factor due to backlash or friction are prevented, and thereby high-accuracy positioning is enabled.

In addition, variation and fluctuation of the driving condition resulting from the abrasion of the connection portions a, b, c, d can be excluded, and the deterioration of the driving displacement characteristic is prevented, and thereby it is possible to stably perform displacement conversion of the driving displacement of the piezoelectric element 14.

The compression spring 15 is provided between the base 10 and the third displacement portion 12, and gives restoring forces F3 of the compression spring 15. At this time, it is desirable that the arrow A that is the driving direction of the dielectric body 4 and the direction of the restoring force F3 of the compression spring 15 are approximately coincident with each other. With the configuration like this, since the displacement conversion mechanism 5 can be configured without newly adding supporting components or the like for providing the compression spring 15, it is possible to give a pre-pressure F4 to the piezoelectric element via the second displacement portion 11 and the third displacement portion 12, without impairing the feature of being small and simple which the displacement conversion mechanism 5 has.

As this result, occurrence of the damage of the piezoelectric element 14 resulting from a tension load to be applied at the time of high speed driving can be prevented, and thereby the dielectric body 4 can be driven at a higher speed.

A through hole 10e is provided in the base 10, and the dielectric body 4 is irradiated with a laser light 16 from a laser type displacement sensor (not shown) installed outside via the through hole 10e, and a position of the dielectric body 4 can be measured with a high accuracy while an end surface of the dielectric body 4 is determined as a measuring object. As will be described later, by this means, the position of the dielectric body 4 is measured, and a high accuracy position control of the dielectric body 4 can be realized, by using a publicly-known closed loop control device to determine an operation amount of the piezoelectric element 14 based on the measurement result. As this result, even when the individual difference of the piezoelectric elements 14, working errors of the two-stage displacement conversion lever 13 and the elastic hinge portions, and variation and fluctuation of the driving condition due to environmental temperature change and vibration influence are present, since these can be corrected, and the variable gap length G by stable driving of the dielectric body 4 can always be provided, further stability improvement of filter characteristic in the tunable filter device 1 can be expected.

Figure 5A:
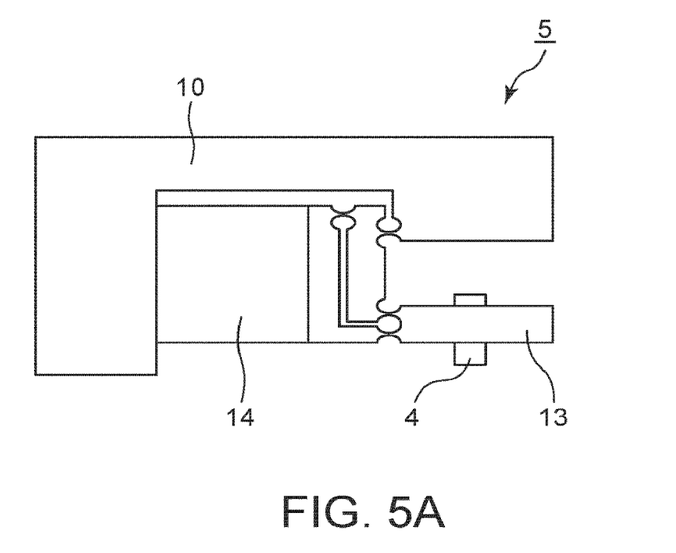
FIG. 5A is a diagram showing an operation example of the displacement conversion mechanism 5.
Figure 5B:
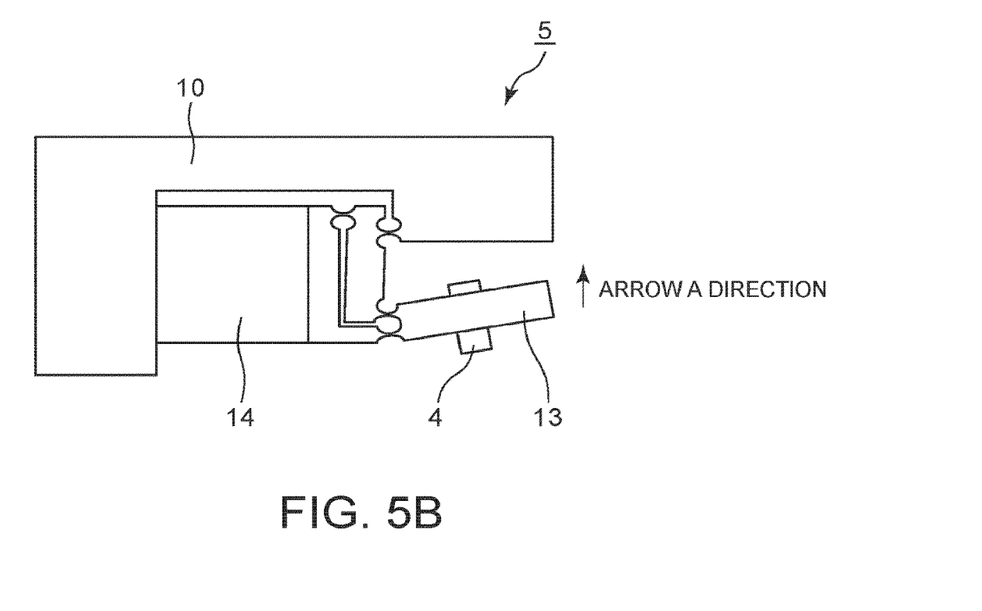
FIG. 5B is a diagram showing an operation example of the displacement conversion mechanism 5.

FIGS. 5A and 5B are diagrams showing an operation example of the displacement conversion mechanism 5. In the drawings, FIG. 5A is a view showing an initial state, and in the drawings, FIG. 5B is an analysis example showing a state in which the piezoelectric element 14 is operated, and the dielectric body 4 is driven.

In the example of FIG. 5B, a driving displacement of the piezoelectric element 14 is enlarged based on a prescribed displacement enlargement factor, by a displacement enlarging function of the two-stage displacement conversion lever 13, and the dielectric body 4 moves approximately in the direction of the arrow A. By this means, the gap length G with the filter substrate 3 is varied.

The two-stage displacement conversion lever 13 is elastically deformed at each of the connection portions a-d, and drives and displaces the dielectric body 4 in the direction of the arrow A. As is clear from the present diagram, an aspect that though the operating displacement of the piezoelectric element 14 is small, the dielectric body 4 is largely driven and displaced upwardly by the displacement conversion function of the two-stage displacement conversion lever 13 can be confirmed.

As this result, miniaturization of the tunable mechanism can be expected, from the feature of the mechanism in which a large displacement amount can easily be obtained. In addition, the above-described content has explained function concept of the displacement enlarging mechanism, and does not indicate an accurate moving amount. An actual moving mount of the dielectric body 4 is not determined by only the distances between the fulcrum point, the force point and working point described above, but is largely affected by mechanical stiffness of the two-stage displacement conversion lever 13 and the connection points a-d and a drive frequency, and thereby it is necessary to estimate a moving amount by performing precise design evaluation by structure analysis or the like.

Second Embodiment

Figure 6A:
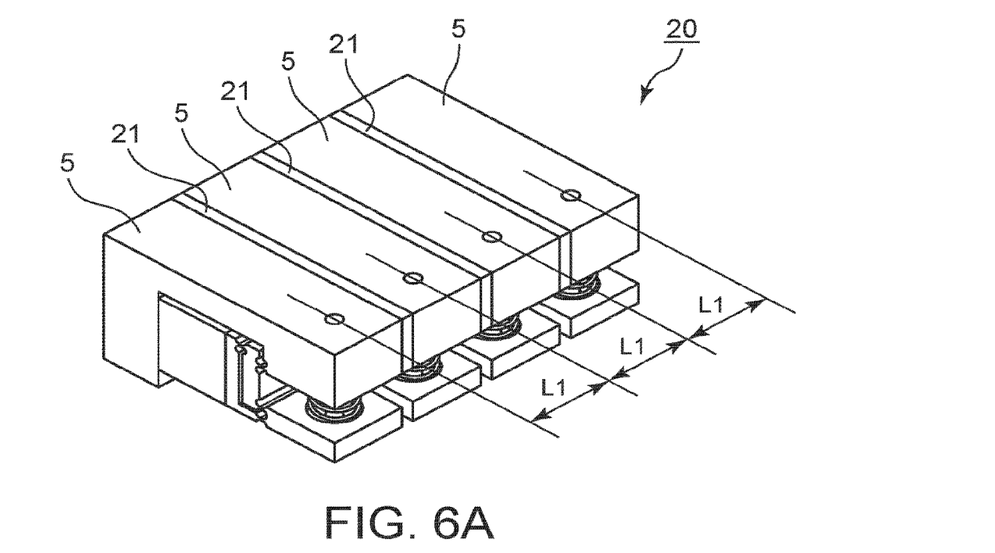
FIG. 6A is a diagram showing a multi dielectric body drive mechanism 20.
Figure 6B:
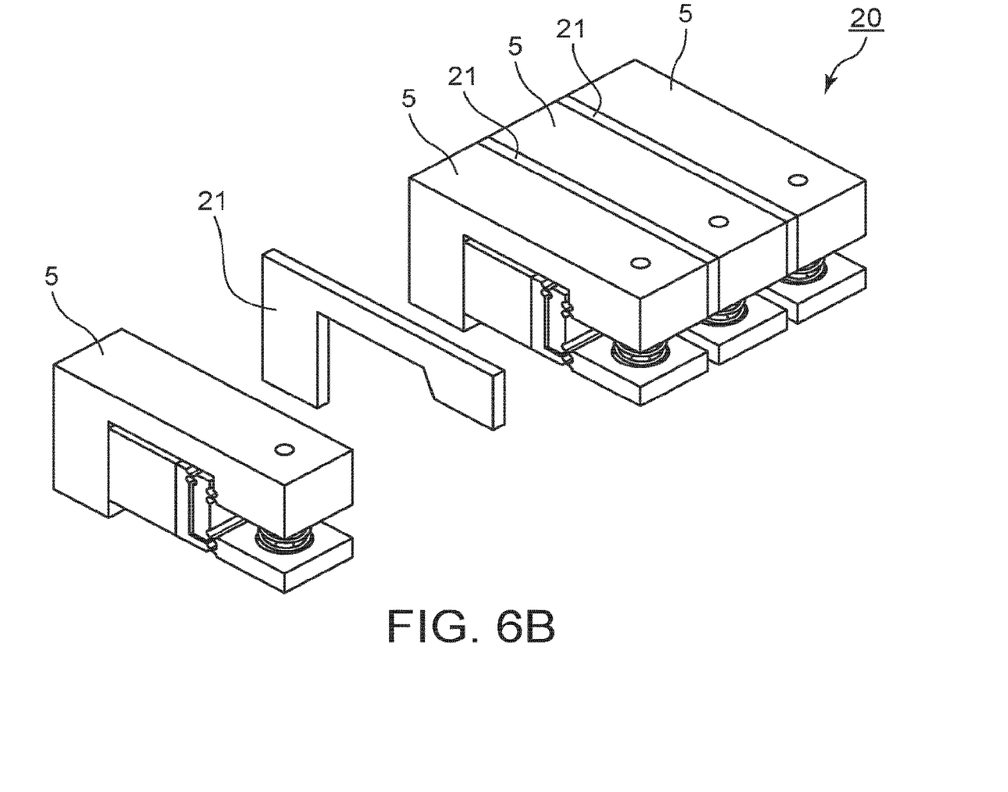
FIG. 6B is a diagram showing a multi dielectric body drive mechanism 20.

FIGS. 6A and 6B shows a displacement conversion mechanism according to a second embodiment. This displacement conversion mechanism is configured by a multi dielectric body drive mechanism 20 which is composed of the four displacement conversion mechanisms 5. In the drawings, FIG. 6A is a perspective view of the multi dielectric body drive mechanism 20, and in the drawings, FIG. 6B is a partially exploded perspective view for explaining the detail of the configuration by exploding a part thereof. Particularly, in the case of a superconductive filter, even when resonant elements are formed in a multistage, the loss thereof can be reduced, and it is possible to obtain an extremely steep frequency characteristic (skirt characteristic), and accordingly the superconductive filter substrate 3 provided with a plurality of resonant elements is sometimes used. In this case, it is preferable that a plurality of the dielectric bodies 4 are arranged at positions facing adjacent resonant elements, to control the gap lengths G, respectively. For this reason, it is necessary for the dielectric body drive mechanism that the whole device is miniaturized, and in addition, the dielectric body drive mechanisms are arranged at respective positions corresponding to a plurality of resonant elements which are arranged adjacently.

Accordingly, the multi dielectric body drive mechanism 20 is provided with the four displacement conversion mechanisms 5 corresponding to four adjacent resonant elements. The displacement conversion mechanisms 5 are integrated via spacers 21 by fastening means (not shown), and the dielectric bodies 4 are arranged in parallel with each other with an adjacent distance L1. Since in the displacement conversion mechanism 5, the piezoelectric element and the two-stage displacement conversion lever 13 and the other constituent elements are configured approximately in the same plane, it is possible to easily arrange a plurality of the displacement conversion mechanisms 5 in parallel with each other at the relatively short adjacent distance L1.

In addition, since the base 10 and the spacer 21 can be joined at the whole side surfaces thereof, it is possible to configure the multi mechanism without reducing the stiffness thereof.

Third Embodiment

Figure 7A:
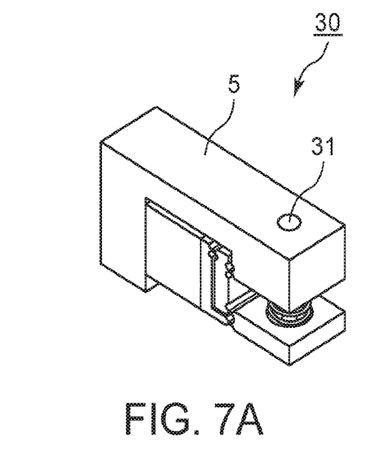
FIG. 7A is a diagram showing a servo type displacement conversion mechanism 30 and a sectional view thereof.
Figure 7B:
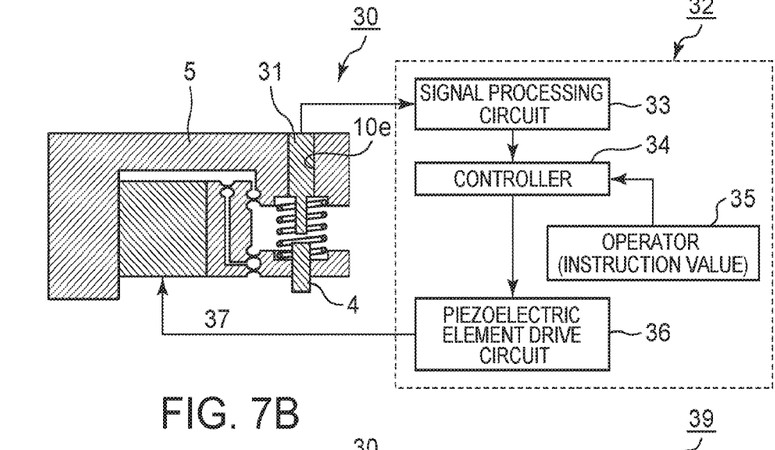
FIG. 7B is a diagram showing a servo type displacement conversion mechanism 30 and a sectional view thereof.
Figure 7C:
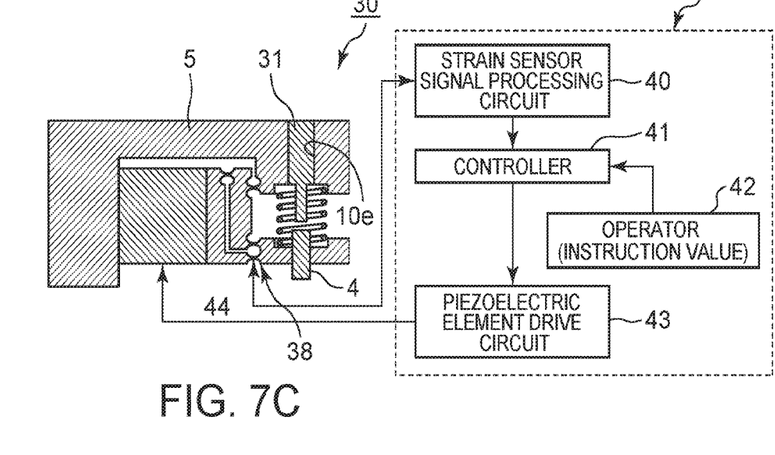
FIG. 7C is a diagram showing a servo type displacement conversion mechanism 30 and a sectional view thereof.

FIGS. 7A, 7B and 7C shows a servo type displacement conversion mechanism according to a third embodiment. A servo type displacement conversion mechanism 30 incorporates the displacement conversion mechanism 5 and a noncontact type displacement sensor 31 for measuring an operation displacement of the dielectric body 4 in the displacement conversion mechanism 5. In the drawings, FIG. 7A is a perspective view of the servo type displacement conversion mechanism 30, and in the drawings, FIG. 7B is a sectional view thereof. The noncontact type displacement sensor 31 is inserted into the through hole 10e of the base 10. As the noncontact type displacement sensor 31, a publicly-known sensor of a laser type, an eddy current type, an electrostatic capacitance type or the like can be used. For example, if it is a laser type, the dielectric body 4 is irradiated with laser light (not shown) from the noncontact type displacement sensor 31, and a position of the dielectric body 4 becomes measurable with a high accuracy, while an end surface of the dielectric body 4 is determined as a measuring object. If it is an eddy current type, or an electrostatic capacitance type, a processing having measuring surface characteristic in accordance with its measuring system is carried out on an edge surface of the dielectric body 4.

In the drawings, FIG. 7B shows a control system 32 of a tunable mechanism which is configured using the noncontact type displacement sensor 31. Position information of the dielectric body 4 is measured by the noncontact type displacement sensor 31 installed in the through hole 10e of the base 10. This measured position information is supplied to the control system 32.

Specifically, a sensor signal of the noncontact type displacement sensor 31 is supplied to a signal processing circuit 33.

This signal processing circuit 33 performs a prescribed signal processing to the inputted sensor signal, and outputs an output signal to the controller 34. The controller 34 obtains an operation signal 35 of the piezoelectric element 14, based on the output signal of the signal processing circuit 33, and an instruction value inputted by an operator.

And a piezoelectric element drive circuit 36 generates a drive voltage 37 of the piezoelectric element 14, based on the operation signal 35, and supplies it to the piezoelectric element 14. By this means, it is possible to construct a dielectric body position feedback control of a tunable mechanism which measures a position of the dielectric body by the sensor signal from the noncontact type displacement sensor 31.

In addition, a publicly-known contact type displacement sensor may be used, in place of the noncontact type displacement sensor 31.

In addition, a strain sensor 38 may be used in place of the displacement sensor. In the drawings, FIG. 7C shows a control system 39 in the case that a strain sensor is used. The strain sensor 38 is stuck to the vicinity of a position of each of the connection portions a-d (elastic hinges). Basically, it is preferable to stick the strain sensor 38 to a connection portion of a position where a deformation amount is large. Here, it is preferable to stick the strain sensor 38 to the connection portion b or the connection portion c.

The strain sensor 38 measures a strain amount which is generated in accordance with elastic deformation of the elastic hinge. Strain information thus measured is supplied to the control system 39. Specifically, a sensor signal of the strain sensor 38 is supplied to a strain sensor signal processing circuit 40. This strain sensor signal processing circuit 40 performs a prescribed signal processing to the inputted sensor signal, and outputs an output signal to a controller 41. The controller 41 obtains an operation signal 42 of the piezoelectric element 14, based on the output signal of the strain sensor signal processing circuit 40, and an instruction value inputted by an operator.

And a piezoelectric element drive circuit 43 generates a drive voltage 44 of the piezoelectric element 14, based on the operation signal 42, and applies it to the each piezoelectric element 14. By this means, it is possible to construct a dielectric body position feedback control of a tunable mechanism which indirectly measures (estimates) a position of the dielectric body by a strain amount from the strain sensor 38.

According to the servo type displacement conversion mechanism 30, the position of the dielectric body 4 can be measured, without providing displacement measuring means for measuring the dielectric body 4 outside, and a high accuracy position control of the dielectric body 4 can be realized, by using a publicly-known closed loop control device to determine an operation amount of the piezoelectric element 14 based on the measurement result. By this means, miniaturization of the whole tunable filter device including the dielectric body drive mechanism can be further achieved.

Fourth Embodiment

Figure 8A:
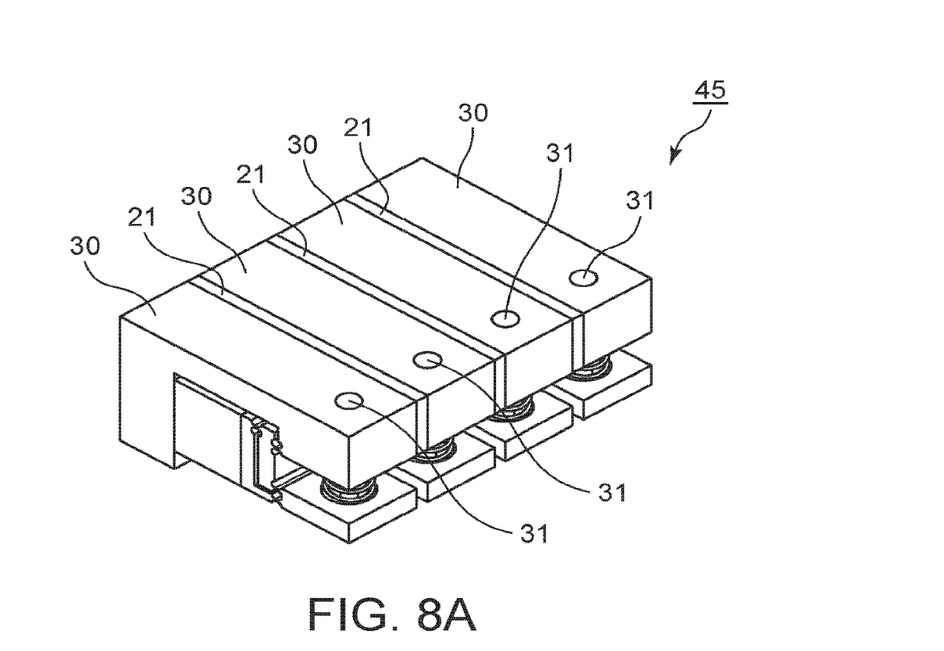
FIG. 8A is a diagram showing a multi dielectric body drive mechanism 40.
Figure 8B:
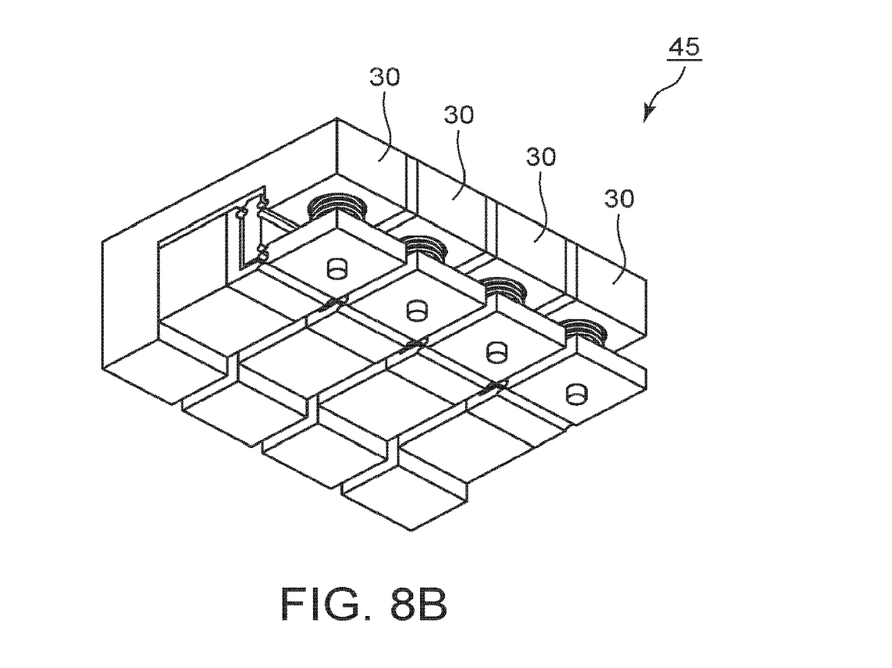
FIG. 8B is a diagram showing a multi dielectric body drive mechanism 40.

FIGS. 8A and 8B shows a multi dielectric body drive mechanism 45 according to a fourth embodiment. The multi dielectric body drive mechanism 45 includes the four servo type displacement conversion mechanisms 30. The servo type displacement conversion mechanisms 30 are integrated via the spacers 21 by fastening means (not shown).

In the drawings, FIG. 8A is a perspective view of the multi dielectric body drive mechanism 45, and in the drawings, FIG. 8B is a perspective view of it seen from the bottom surface direction. The servo type displacement conversion mechanisms 30 incorporate the noncontact type displacement sensors 31, and are connected to the control systems 32, respectively, and thereby it is possible to independently control the gap lengths G of a plurality of the dielectric bodies 4. The drive circuit of the control system 32 may be configured so as to drive the four servo type displacement conversion mechanisms 30 by one circuit.

Fifth Embodiment

Figure 9A:
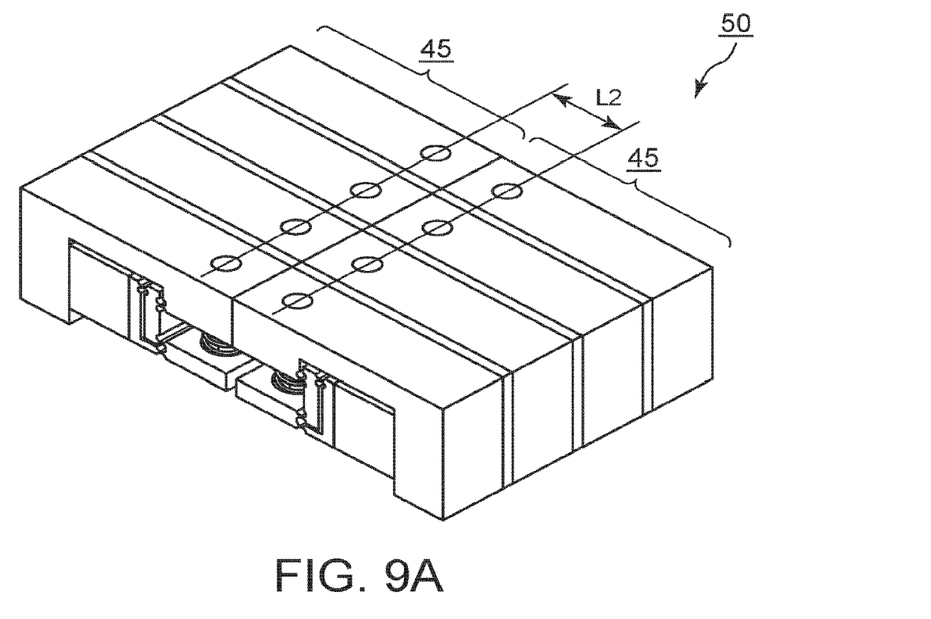
FIG. 9A is a diagram showing a multi dielectric body drive mechanism 50.
Figure 9B:
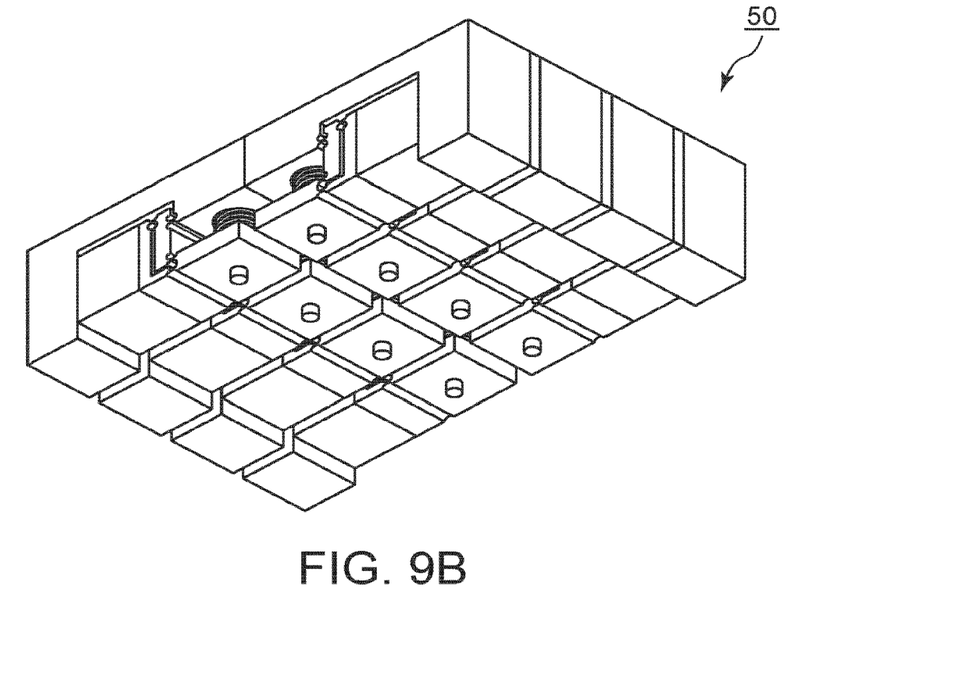
FIG. 9B is a diagram showing a multi dielectric body drive mechanism 50.

FIGS. 9A and 9B show a multi dielectric body drive mechanism according to a fifth embodiment. A multi dielectric body drive mechanism 50 includes the two multi dielectric body drive mechanisms 45, that is, totally the eight servo type displacement conversion mechanisms 30. In the drawings, FIG. 9A is a perspective view of the multi dielectric body drive mechanism 50, and in the drawings, FIG. 9B is a perspective view of it seen from the bottom surface direction. Base outer surfaces 10f of the bases 10 of the servo type displacement conversion mechanisms 30 are joined to each other, and the eight servo type displacement conversion mechanisms 30 are integrated via the spacers 21 by fastening means (not shown), and thereby the dielectric bodies 4 are arranged in parallel with an adjacent distance L2.

Since the dielectric body 4 of the servo type displacement conversion mechanism 30 is arranged at an end portion of the mechanism, the relatively short adjacent distance L2 can be obtained by joining the base outer surfaces 10f themselves.

The servo type displacement conversion mechanisms 30 incorporate the noncontact type displacement sensors 31, and are connected to the control systems 32, respectively, and thereby it is possible to independently control the gap lengths G of a plurality of the dielectric bodies 4. The drive circuit of the control system 32 may be configured so as to drive the eight servo type displacement conversion mechanisms 30 by one circuit.

Figure 10A:
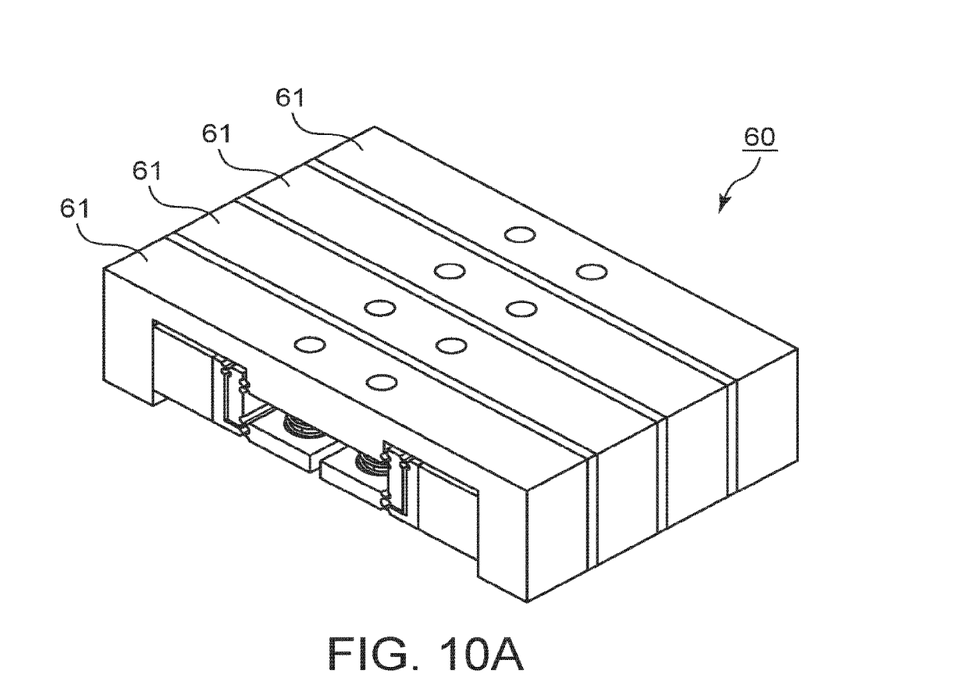
FIG. 10A is a diagram showing a multi dielectric body drive mechanism 60.
Figure 10B:
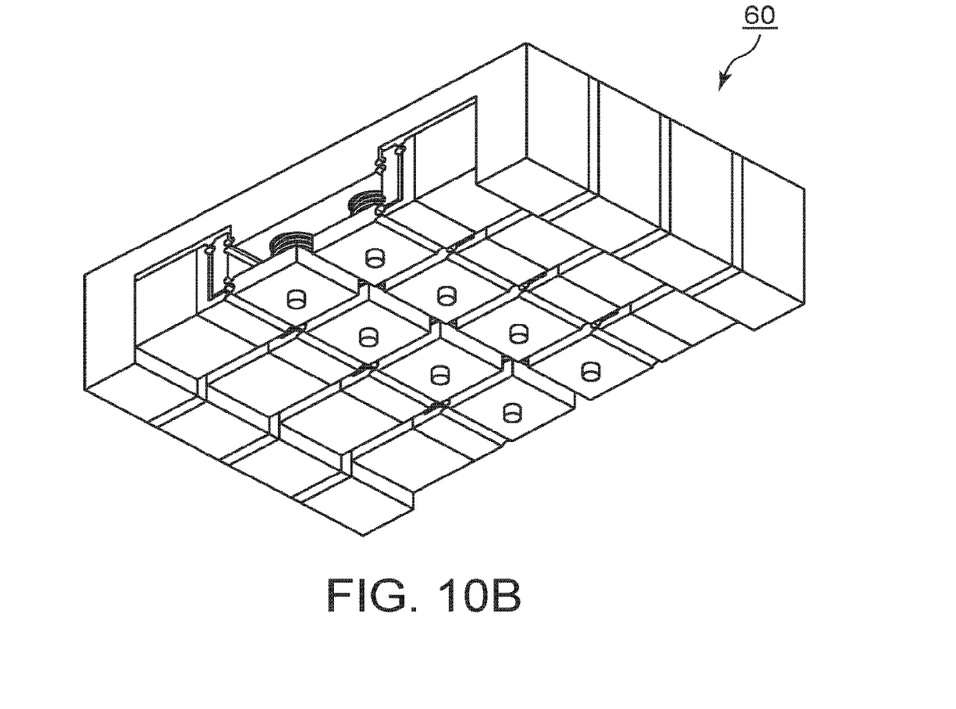
FIG. 10B is a diagram showing a multi dielectric body drive mechanism 60.

FIGS. 10A and 10B are diagrams showing a configuration of a multi dielectric body drive mechanism 60 that is a modification of the multi dielectric body drive mechanism 50. In the drawings, FIG. 10A is a perspective view of the multi dielectric body drive mechanism 60, and in the drawings, FIG. 10B is a perspective view of it seen from the bottom surface direction. The basic configuration of the multi dielectric body drive mechanism 60 is the same as the multi dielectric body drive mechanism 50, but is different in the point that the two facing bases are integrally formed.

Figure 11A:
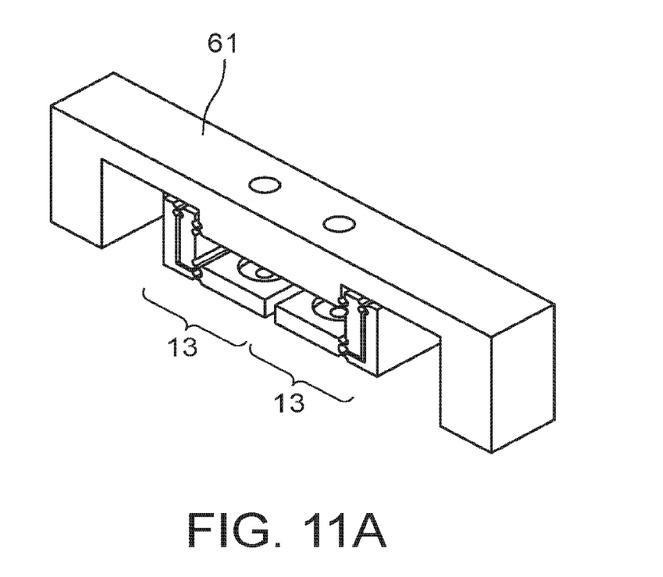
FIG. 11A is a diagram showing the base 61 of the multi dielectric body drive mechanism 60.
Figure 11B:
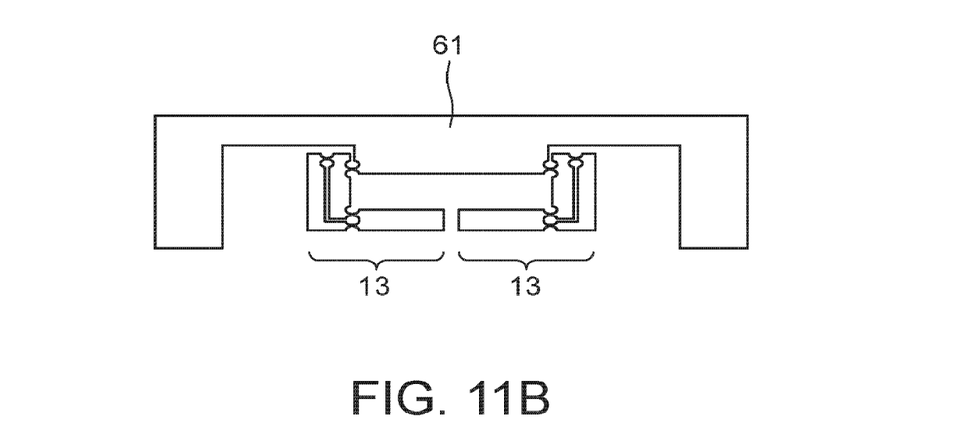
FIG. 11B is a diagram showing the base 61 of the multi dielectric body drive mechanism 60.

FIGS. 11A and 11B are diagrams showing a configuration of a base 61 of the multi dielectric body drive mechanism 60.

In the multi dielectric body drive mechanism 50, the base outer surfaces 10f of the two bases 10 are joined to each other, and four servo type displacement conversion mechanisms are fastened by fastening means (not shown), but regarding the base 61, a pair of the bases are integrally formed from the beginning as one base.

In addition, in the base 61, the two two-stage displacement conversion levers 13 are integrally formed by a wire-cut processing or the like, and thereby fastening of the outer surfaces 10f of the bases is not necessary, and it is possible to realize further miniaturization and low cost. In addition, the deterioration of the stiffness of the fasting portion is excluded, and high stiffness thereof can be achieved.

In the embodiments of FIGS. 1, 2A, 2B, 3A, 3B, 4, 5A, 5B, 6A, 6B, 7A-7C, 8A, 8B, 9A, 9B, 10A, 10B, 11a and 11B, the configuration that the bases 10, 61 and the two-stage displacement conversion lever 13 composed of the second displacement portion 11 and the third displacement portion 12 are integrally formed by a wire-cut processing or the like has been used, but the elastic hinges configuring the connection portions a-d may be formed of members separate from the bases 10, 61, and may by connected and fixed to the bases 10, 61. The elastic hinge is formed of a separate member, and thereby spring steel or the like or resin material which are effective as material of elastic deformation support may be used. In addition, the elastic hinge has been described to have an approximately arc-shaped notch structure, but without being limited to this, an elastic hinge having an elliptical notch structure or a plate spring structure may be used, for example, and the elastic hinge may be changed appropriately in a range without departing from the spirit of the configuration of the present application.

In addition, the elastic hinge is configured by an elastic element in which at least the stiffness in the movable direction of a dielectric body is lower than the stiffness in the otherwise direction, and an elastic element in which at least the stiffness in the operation displacement direction to transmit a drive force of a piezoelectric element is higher than the stiffness in the otherwise direction, and the elastic hinge may be changed appropriately in a range without departing from the spirit of the configuration of the present application.

According to the embodiments described above, it is possible to provide a displacement conversion mechanism using a solid displacement element (piezoelectric element) as a drive source, and a tunable filter device which can adjust frequency characteristic of a filter at a high speed and with a high accuracy using this displacement conversion mechanism. In particular, it is possible to provide a displacement conversion mechanism which can realize miniaturization and can output a desired operating displacement, with a configuration of a displacement conversion mechanism provided with a two-stage displacement conversion lever connected so as to transmit displacement. Further, in a tunable filter device which can make frequency characteristic variable by changing a gap length between a superconductive filter substrate and a dielectric body, it is possible to provide the tunable filter device which is provided with a displacement conversion mechanism, and can deal with high speed, high accuracy control of a variable gap length, with a configuration to adjust a gap length at a prescribed speed and with a prescribed accuracy.

As in this manner, a high speed tunable filter device is provided, and accordingly it becomes possible to flexibly deal with frequency characteristic (center frequency, bandwidth, skirt characteristic and so on) of a bandpass filter which is necessary for an information communication device system, in accordance with various application specifications, and in addition, in the case of making a superconductive filter device high speed tunable, the utilization thereof is expected in a next generation high speed large capacity data communication system, as a technology to solve frequency interference.

In addition, in each of the above-described embodiments, the example to use the dielectric body 4 has been described, but a member to change magnetic field distribution and electric field distribution on a space in the vicinity of the superconductive filter substrate 3 may be used as the dielectric body 4, and a magnetic body such as ferrite, and a conductor such as copper can be used as its material, for example. In addition, in each of the above-described embodiments, the description has been made taking the superconductive filter substrate 3 as an example, but a filter substrate other than the superconductive filter substrate 3 may be used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A displacement conversion mechanism, comprising:
   a base;
   a displacement element which is in contact with the base and displaces in a first direction;
   a first displacement portion which is in contact with the displacement element and is capable to displace in the first direction;
   a second displacement portion, having a first connection portion and a second connection portion, which connects to an end of the first displacement portion at the first connection portion, and connects to the base at the second connection portion; and
   a third displacement portion, having a third connection portion and a fourth connection portion, which connects to the other end of the first displacement portion at the third connection portion, and which connects to an end portion of the second displacement portion at the fourth connection portion, and the third displacement portion being capable to displace in a second direction intersecting with the first direction;
   wherein in each of the first connection portion, the second connection portion, the third connection portion, and the fourth connection portion, stiffness in each of the first direction and the second direction is higher than stiffness in an other direction.

2. The displacement conversion mechanism according to claim 1: wherein the third displacement portion has a piezoelectric element.

3. The displacement conversion mechanism according to claim 2:
   wherein in the third displacement portion, a distance from the third connection portion to the piezoelectric element is longer than a distance from the third connection portion to the fourth connection portion.

4. In a tunable filter device comprising the displacement conversion mechanism according to claim 2, the tunable filter device comprising:

a substrate fixing portion; and a filter substrate having a circuit formed of a conductor film on a part of the substrate fixing portion;

wherein the piezoelectric element is opposite to the circuit, and the third displacement portion moves in accordance with a displacement of the displacement element, and thereby a distance between the piezoelectric element and the circuit changes.

5. The tunable filter device according to claim 4:

wherein the conductor film is formed of a superconductor, and the substrate fixing portion is a cold plate.

6. The tunable filter device according to claim 4, further comprising:

a position sensor to measure a position of the piezoelectric element; and a control device to determine a displacement amount of the displacement element based on position information of the position sensor.

7. The displacement conversion mechanism according to claim 2:

wherein the piezoelectric element is formed of a dielectric body or a magnetic body or a conductor material.

8. The displacement conversion mechanism according to claim 1:

wherein the displacement element is formed of a piezoelectric element or a laminated type piezoelectric element.

9. The displacement conversion mechanism according to claim 1, further comprising: an elastic member to give an elastic force between the base and the third displacement portion.

10. The displacement conversion mechanism according to claim 9:

wherein the elastic force gives a pre-pressure to the displacement element in the first direction via the third displacement portion, the second displacement portion and the first displacement portion.

11. The displacement conversion mechanism according to claim 9:

wherein a direction of the elastic force coincides with the second direction.

12. The displacement conversion mechanism according to claim 1: wherein the second connection portion is located between the first connection portion and the fourth connection portion.

13. A tunable filter device comprising the displacement conversion mechanism according to claim 1.

14. The displacement conversion mechanism according to claim 1: wherein in the second displacement portion, a distance from the second connection portion to the fourth connection portion is longer than a distance from the first connection portion to the second connection portion.

15. The displacement conversion mechanism according to claim 1:

wherein in each of the first connection portion, the second connection portion, the third connection portion and the fourth connection portion, stiffness in the first direction is higher than stiffness in an otherwise direction.

* * * * *